(12) United States Patent
Goh et al.

(10) Patent No.: US 11,172,581 B2
(45) Date of Patent: Nov. 9, 2021

(54) MULTI-PLANAR CIRCUIT BOARD HAVING REDUCED Z-HEIGHT

(71) Applicant: Intel Corporation, Santa Clara, CA (US)

(72) Inventors: Eng Huat Goh, Ayer Itam (MY); Min Suet Lim, Bayan Lepas (MY); Tin Poay Chuah, Bayan Baru (MY); Han Kung Chua, Bayan Lepas (MY)

(73) Assignee: Intel Corporation, Santa Clara, CA (US)

( * ) Notice: Subject to any disclaimer, the term of this patent is extended or adjusted under 35 U.S.C. 154(b) by 336 days.

(21) Appl. No.: 16/003,970

(22) Filed: Jun. 8, 2018

(65) Prior Publication Data

US 2019/0008052 A1  Jan. 3, 2019

(30) Foreign Application Priority Data

Jun. 29, 2017 (MY) .......................... PI 2017702402

(51) Int. Cl.
| | |
|---|---|
| *H05K 3/00* | (2006.01) |
| *H05K 3/46* | (2006.01) |
| *H05K 1/02* | (2006.01) |
| *H05K 1/18* | (2006.01) |
| *H05K 3/30* | (2006.01) |

(52) U.S. Cl.
CPC .......... *H05K 3/4611* (2013.01); *H05K 1/028* (2013.01); *H05K 1/181* (2013.01); *H05K 1/189* (2013.01); *H05K 3/303* (2013.01); *H05K 3/4602* (2013.01); *H05K 2201/091* (2013.01); *H05K 2201/09118* (2013.01); *H05K 2201/10378* (2013.01); *H05K 2201/10522* (2013.01); *H05K 2201/10545* (2013.01)

(58) Field of Classification Search
CPC ...... H05K 3/4611; H05K 1/028; H05K 1/181; H05K 1/189; H05K 3/303; H05K 2201/10378; H05K 2201/10522; H04K 2201/10545

See application file for complete search history.

(56) References Cited

U.S. PATENT DOCUMENTS 5,831,810 A * 11/1998 Bird .................. H01L 23/13
361/301.1
6,061,245 A * 5/2000 Ingraham ............. H01L 23/467
174/254

(Continued)

*Primary Examiner* — Pete T Lee
(74) *Attorney, Agent, or Firm* — Patent Capital Group

(57) ABSTRACT

Disclosed herein is a multi-planar circuit board, as well as related structures and methods. In an embodiment, a circuit board may include a first surface, a first section having the first surface in a first plane, a second section having the first surface in a second plane, and a third section connecting the first and second sections, where the third section defines a gradient between the first and second planes, and where all sections are sections within a contiguous board. In another embodiment, circuit board may further include a first component having a first thickness coupled on the first face of the first section, and a second component having a second thickness, greater than the first component, coupled on the first face of the second section, where the second section is in a lower plane, and where the overall thickness is the circuit board thickness plus the second thickness.

24 Claims, 6 Drawing Sheets

(56) References Cited

U.S. PATENT DOCUMENTS

| | | | | |
|---|---|---|---|---|
| 7,626,827 B2* | 12/2009 | Nielsen | ............... | H01L 23/04 |
| | | | | 174/260 |
| 9,202,782 B2 | 12/2015 | Chuah | | |
| 9,257,410 B2* | 2/2016 | Wu | ..................... | H01L 24/81 |
| 9,293,426 B2 | 3/2016 | Hossain et al. | | |
| 2004/0118594 A1* | 6/2004 | Dory | ................. | H05K 3/005 |
| | | | | 174/250 |
| 2008/0047135 A1 | 2/2008 | Arnold | | |
| 2009/0077800 A1* | 3/2009 | Randall | ............. | H05K 1/141 |
| | | | | 29/854 |
| 2009/0186169 A1* | 7/2009 | Shacklette | ....... | H01M 2/1022 |
| | | | | 428/1.6 |
| 2013/0341075 A1* | 12/2013 | Becker | ............ | H05K 3/0064 |
| | | | | 174/255 |
| 2015/0003482 A1* | 1/2015 | Monadgemi | ....... | H01S 5/0222 |
| | | | | 372/44.01 |
| 2015/0323568 A1* | 11/2015 | Schmitt | ........... | G01R 1/0408 |
| | | | | 324/126 |
| 2016/0049316 A1 | 2/2016 | Chuah | | |

* cited by examiner

MULTI-PLANAR CIRCUIT BOARD HAVING REDUCED Z-HEIGHT

CROSS REFERENCE TO RELATED APPLICATION

This application claims priority to Malaysia Patent Application No. PI 2017702402, filed Jun. 29, 2017, and titled "MULTI-PLANAR CIRCUIT BOARD HAVING REDUCED Z-HEIGHT," the entire contents of which are hereby incorporated by reference.

FIELD

This disclosure relates generally to the field of semiconductor technology and, in particular, methods and apparatuses for a circuit board with reduced z-height.

BACKGROUND

Mobile, tablet, ultrabook, and other portable devices based on semiconductor technology are trending towards increasingly reduced dimensions, including thinner form factors. Components are typically mounted on the surfaces of a circuit board, and as such the thickness of the integrated circuit are generally determined by the z-height of the components.

BRIEF DESCRIPTION OF THE DRAWINGS

Embodiments described herein illustrated by way of example and not limitation in the figures of the accompanying drawings, in which like references indicate similar features. The following figures are illustrative, and other processing techniques or stages can be used in accordance with the subject matter described herein. The accompanying drawings are not necessarily drawn to scale. Furthermore, some conventional details have been omitted so as not to obscure from the inventive concepts described herein.

DETAILED DESCRIPTION

Figure 1:
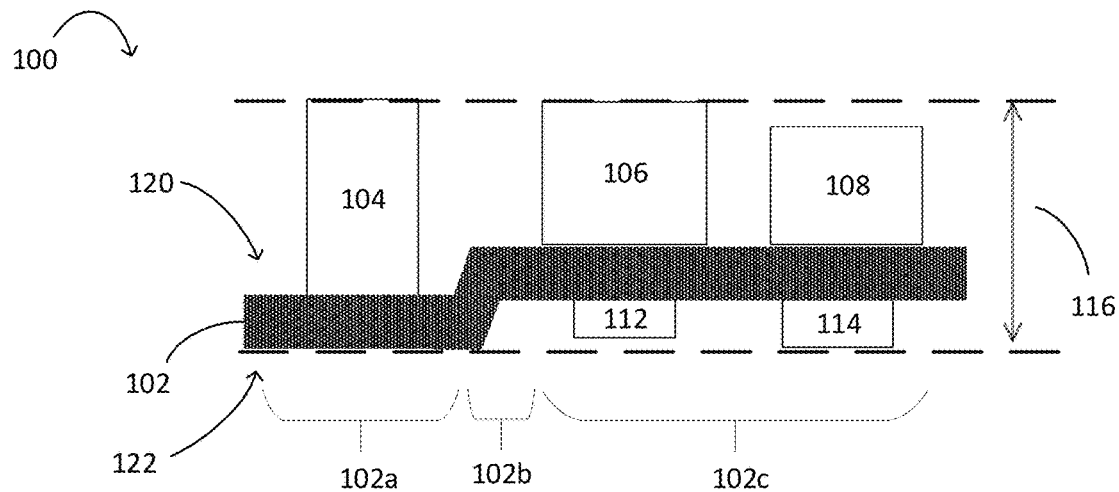
FIG. 1 is a schematic illustration of a side view of an exemplary multi-planar circuit board, according to some embodiments of the present disclosure.

Disclosed herein is a circuit board having multiple planes, as well as related structures, devices, and methods. For example, in some embodiments, a circuit board may include a first section in a first plane, a second section in a second plane, and a third section connecting the first and second sections, where the third section defines a gradient or slope between the first and second planes, and where the first, second, and third sections are sections within a contiguous board. In some embodiments, a circuit board may further include a fourth section in a third plane and a fifth section connecting the second and fourth sections, where the fifth section defines a gradient between the second and fourth planes, and where all sections are sections within a contiguous board. In some embodiments, a circuit board having opposing first and second faces may further include a first component having a first thickness coupled to the first face of the first section of the circuit board, and a second component having a second thickness coupled to the first face of the second section of the circuit board, where the second integrated circuit package is thicker than the first integrated circuit package, and where the second plane is in a lower plane as compared to the first plane. In some embodiments, a circuit board may further include one or more components coupled to the second face of the circuit board, where the one or more components coupled to the second face do not increase the overall thickness.

In the following detailed description, reference is made to the accompanying drawings that form a part hereof, wherein like numerals designate like parts throughout, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense. The accompanying drawings are not necessarily drawn to scale.

Various operations may be described as multiple discrete actions or operations in turn, in a manner that is most helpful in understanding the disclosed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

Throughout the specification, and in the claims, the terms "connected" and "coupled" mean a direct or indirect connection, such as a direct electrical, mechanical, or magnetic connection between the things that are connected or an indirect connection, through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

As used herein, the term "thickness" or "height" refers to a dimension of a certain element or layer as measured along the z-axis, the term "width" refers to a dimension of a certain element or layer as measured along the y-axis, while the term "length" refers to a dimension of a certain element or layer as measured along the x-axis.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C). The term "between," when used with reference to measurement ranges, is inclusive of the ends of the measurement ranges. As used herein, the notation "A/B/C" means (A), (B), and/or (C).

The terms "left," "right," "front," "upper," "lower," "back," "top," "bottom," "over," "under," "on," "between," and the like in the description and in the claims, if any, are used for descriptive purposes and not necessarily for describing permanent relative positions. For example, one layer over, or under another layer may be directly in contact with the other layer or may have one or more intervening layers. Moreover, one layer between two layers may be directly in contact with the two layers or may have one or more intervening layers. In contrast, a first layer "on" a second layer is in direct contact with that second layer. Similarly, unless explicitly stated otherwise, one feature between two features may be in direct contact with the adjacent features or may have one or more intervening layers.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

A circuit board, such as a motherboard, may be used to mechanically support and electrically connect an electrical component. A circuit board may be single-sided, where components are attached on a top or bottom surface, or double-sided, where components are attached on both the top and bottom surfaces. The overall thickness of an electronic device, particularly mobile and handheld products, may be defined by the thickness of the circuit board, the electronic components attached to the circuit board, and whether the circuit board is single-sided or double-sided.

One technique to reduce the thickness or z-height of a circuit board is to utilize a high density interconnect (HDI) printed circuit board process, which may reduce the number of layers and/or the thickness of the layers in the circuit board. Another technique to reduce the thickness or z-height of a circuit board is to utilize a flex rigid circuit board, where rigid circuit boards are connected by flexible connectors, however, the electrical connection requirements from board to board may limit the maximum allowable layers.

The exemplary circuit boards disclosed herein provide for minimized z-height in a contiguous circuit board such that signal integrity is maintained across the entire circuit board. By modifying the plane of sections of a contiguous printed circuit board, the overall combined thickness or z-height of the circuit board and the components may be minimized. For example, a single-sided circuit board may be converted to a double-sided circuit board without increasing the overall thickness by lowering the plane of the circuit board in sections where components are taller as compared to sections where components are shorter such that additional components may be coupled to the back or second side of the circuit board on these sections. In another example, the overall thickness of a double-sided circuit board may be reduced by lowering the plane of the circuit board in sections where components are taller or thicker as compared to sections where components are shorter or less thick such that the components fit within the differential between the planes.

FIG. 1 depicts a schematic illustration of a side view of an example multi-planar circuit board, according to some embodiments of the present disclosure. Assembly 100 may include a circuit board having opposing first and second surfaces or faces 120, 122. Assembly 100 may include a circuit board 102 having a number of components 104, 106, 108, 112, 114 coupled thereon. As shown, circuit board 102 may be double-sided such that components 104, 106, 108 are disposed on a first face 120 of circuit board 102 and components 112, 114 are disposed on an opposing second face 122 of the circuit board 102. Circuit board 400 may be designed having a plurality of planes to optimize surface component connections and reduce overall z-height by calculating the minimum overall z-height determining the height of the tallest component and adding the thickness of the circuit board.

Circuit board 102 may include a first section 102a having the first surface in a first plane, a second section 102c having the first surface in a second plane, and a third or gradient section 102b connecting the first and second sections, where the first, second, and third sections are sections within a contiguous circuit board. The third section defines a gradient between the first and second planes along the first surface. As shown, the overall z-height 116 equals the thickness of the circuit board 102 plus the height of the tallest component 104, which is the thinnest z-height achievable with the circuit board and components as shown in FIG. 1. For example, assuming component 104 is 1.2 mm tall, circuit board 102 is 0.7 mm thick, and component 114 is 0.5 mm tall, the overall z-height is equal to 1.2 mm plus 0.7 mm, or 1.9 mm.

The planes for circuit board sections 102a, 102c may be determined by the size and patterning of components coupled thereon. In FIG. 1, first section 102a has the tallest component 104 coupled to the first face 120, such that first section 102a is in a lower plane compared to second section 102c, which has shorter components 106, 108 coupled to the first face 120. As such, additional components 112, 114 may be coupled to the second face 122 of second section 102c without increasing the overall z-height 116. Although circuit board sections 102a, 102c are depicted as being straight along a horizontal plane, in some embodiments, the sections may be angled upwards or downwards.

Circuit board 102 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers)

between the components coupled to circuit board 102. In other embodiments, circuit board 102 may be a non-PCB substrate.

Component 104, 106, 108, 112, 114 may be electrically and/or mechanically coupled to the circuit board 102, and may include solder balls, male and female portions of a socket, an adhesive, an underfill material, and/or any other suitable electrical and/or mechanical coupling structure. In some embodiments, such components may include, but are not limited to, a microprocessor (e.g., central processing unit, system on chip), capacitors, decoupling capacitors, resistors, inductors, fuses, diodes, transformers, sensors, power delivery inductors, electrostatic discharge (ESD) devices, storage (e.g., SSD), and memory devices (e.g., dynamic random access memory (DRAM)). In some embodiments, such component may include an integrated circuit package having a die coupled to a package substrate. The package substrate may have a die side surface and an opposing land side surface. A die may be coupled to the package substrate on the die side surface via first level interconnects disposed at the die side surface or top face of the package substrate. The package substrate may be coupled to a circuit board via the second level interconnects disposed at the land side surface or bottom face of the package substrate. The second level interconnects may include solder balls for a ball grid array (BGA) coupling, solder paste contacts to provide land grid array (LGA) interconnects, or any other suitable interconnect. Circuit board 102 may include conductive pathways that allow power, ground, and other electrical signals to move between the circuit board and an electrically coupled component.

Figure 2:
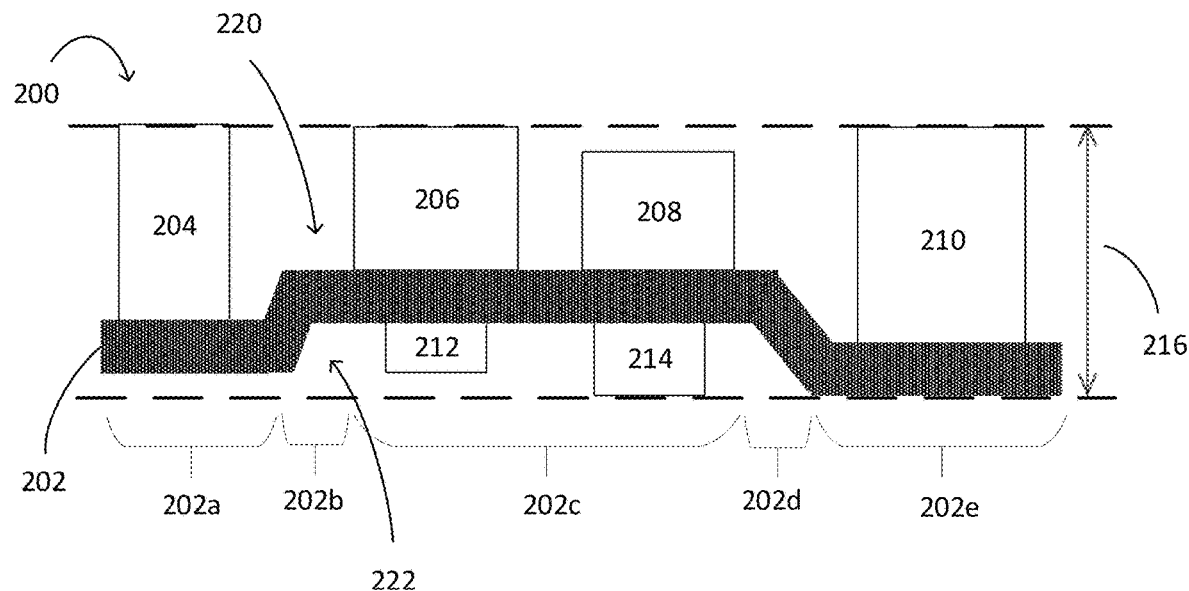
FIG. 2 is a schematic illustration of a side view of another exemplary multi-planar circuit board, according to some embodiments of the present disclosure.

FIG. 2 depicts a schematic illustration of a side view of another exemplary multi-planar circuit board, according to some embodiments of the present disclosure. Assembly 200 may include a circuit board having opposing first and second faces 220, 222. Assembly 200 may include a circuit board 202 having a plurality of components 204, 206, 208, 210, 212, 214 coupled thereon. As shown, circuit board 202 may be double-sided such that components 204, 206, 208, 210 are disposed on a first face 220 and components 212, 214 are disposed on an opposing second face 222.

As shown in FIG. 2, circuit board 202 may include a first section 202a in a first plane, a second section 202c in a second plane, a third section 202b connecting the first and second sections and defining a gradient between the first and second planes, a fourth section 202e in a third plane, and a fifth section 102d connecting the second and fourth sections and defining a gradient between the second and third planes, where all sections (i.e., the first, second, third, fourth, and fifth sections) are sections within a contiguous circuit board. As shown, the overall z-height 216 equals the thickness of the circuit board 202 plus the height of the tallest component 210, which is the thinnest z-height achievable with the circuit board and components as shown in FIG. 2. For example, assuming component 210 is 1.65 mm tall, circuit board 202 is 0.7 mm thick, and component 214 is 0.5 mm tall, the overall z-height is equal to 1.65 mm plus 0.7 mm, or 2.35 mm.

As shown in FIG. 2, the planes for circuit board sections 202a, 202c, 202e may be determined by the size and patterning of components coupled thereon. In some embodiments, for example, sections 202a, 202c, 202e may be in three different planes. In some embodiments, sections 202a, 202e may be in a same plane while section 202c may be in a different plane.

Although FIG. 2 only shows three planar sections, it may be understood that a multi-planar circuit board may be designed to have as many planes as necessary for accommodating components and minimizing z-height, and is likely to have more than three planar sections. Further, while FIGS. 1 and 2 show the overall z-height as no more than the tallest component plus the thickness of the circuit board, it may be understood that the overall z-height may be greater than this minimum z-height.

Figure 3A:
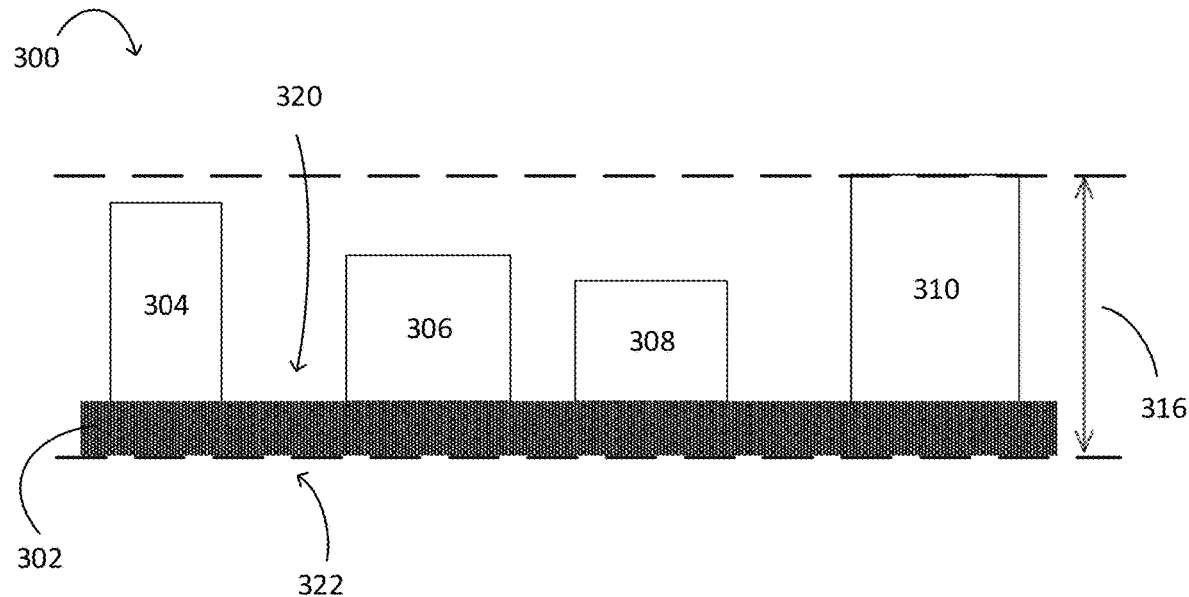
FIG. 3A is a schematic illustration of a side view of a single-sided planar printed circuit board having the integrated circuit packages of FIG. 2.

FIG. 3A is a schematic illustration of a side view of a portion of a single-sided planar printed circuit board having the integrated circuit packages of FIG. 2. Assembly 300 may include a circuit board 302 in a single plane having opposing first and second faces 320, 322. Assembly 300 may include a circuit board 302 having a plurality of components 304, 306, 308, 310 coupled only on a first face 320. In FIG. 3A, the overall z-height 316 equals the thickness of the circuit board 302 plus the height of the tallest component 310, which is the thinnest z-height achievable with the circuit board and components as shown in FIG. 3A. For example, assuming component 310 is 1.65 mm tall and circuit board 302 is 0.7 mm thick, the overall z-height is equal to 1.65 mm plus 0.7 mm, or 2.35 mm. Assuming all dimensions in FIG. 3A are equal for equivalent features in FIG. 2, the multi-planar circuit board of FIG. 2 allows for two additional components 212, 214 to be coupled within the same overall z-height. In FIG. 3A, these additional components would be coupled on the first surface, which is likely to increase to overall size (i.e., surface area) of circuit board 302.

Figure 3B:
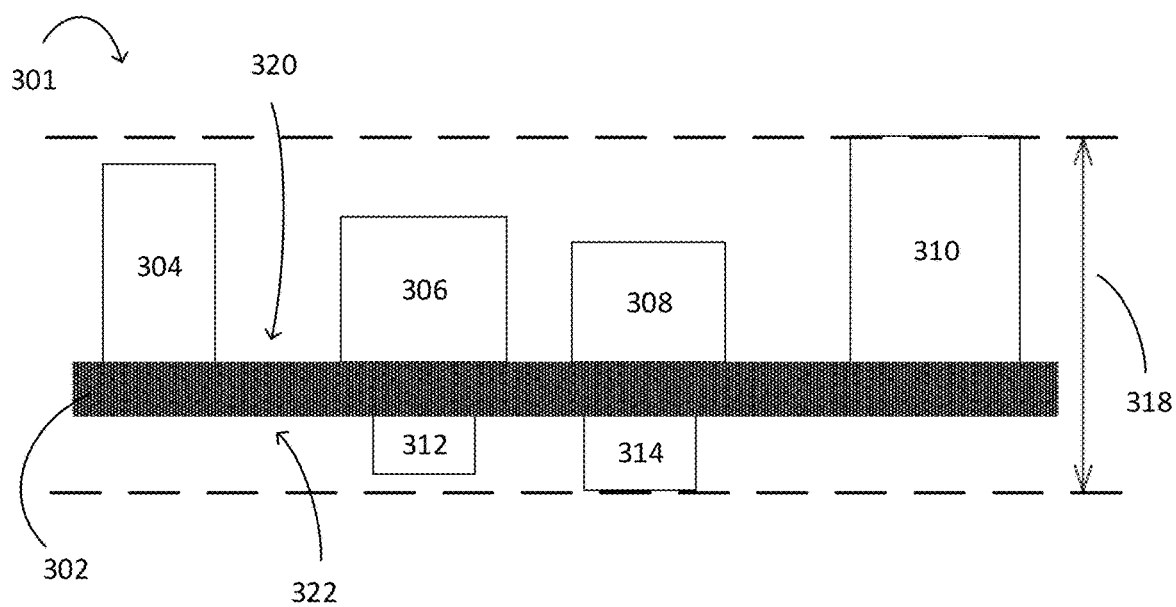
FIG. 3B is a schematic illustration of a side view of a double-sided planar printed circuit board having the integrated circuit packages of FIG. 2.

FIG. 3B is a schematic illustration of a side view of a portion of a double-sided planar printed circuit board having the integrated circuit packages of FIG. 2. Assembly 301 may include a circuit board 302 having opposing first and second faces 320, 322. Assembly 301 may include a circuit board 302 having a plurality of components 304, 306, 308, 310, 312, 314 coupled thereon. As shown, circuit board 302 may be double-sided such that components 304, 306, 308, 310 are disposed on a first face 320 and components 312, 314 are disposed on an opposing second face 322. In FIG. 3B, the overall z-height 318 equals the thickness of the circuit board 302 plus the height of the tallest component 310 on the first face 320 plus the tallest component 314 on the second face 322, which is the thinnest z-height achievable with the circuit board and components as shown in FIG. 3B. For example, assuming component 310 is 1.65 mm tall, circuit board 302 is 0.7 mm thick, and component 314 is 0.5 mm tall, the overall z-height is equal to 1.65 mm plus 0.7 mm plus 0.5 mm, or 2.85 mm. While FIG. 3B has the same components as FIG. 2, the z-height is increased.

Figure 4A:
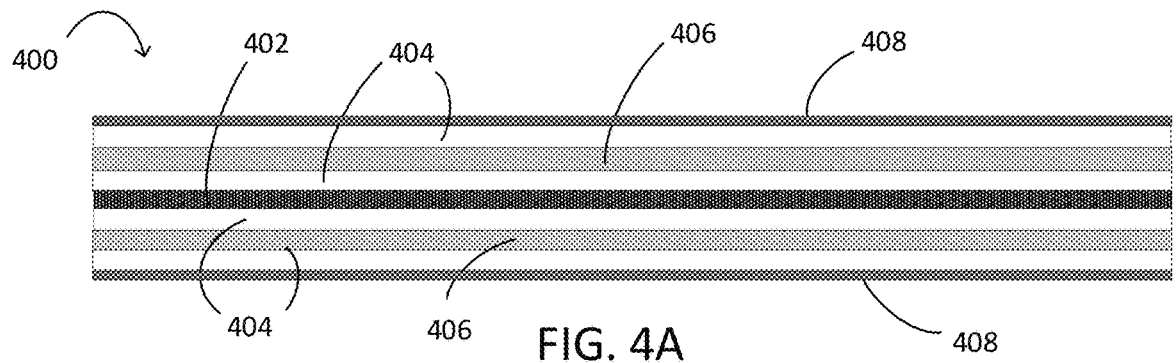
FIGS. 4A, 4B, and 4C are schematic illustrations of forming an exemplary multi-planar circuit board, according to some embodiments of the present disclosure.
Figure 4B:
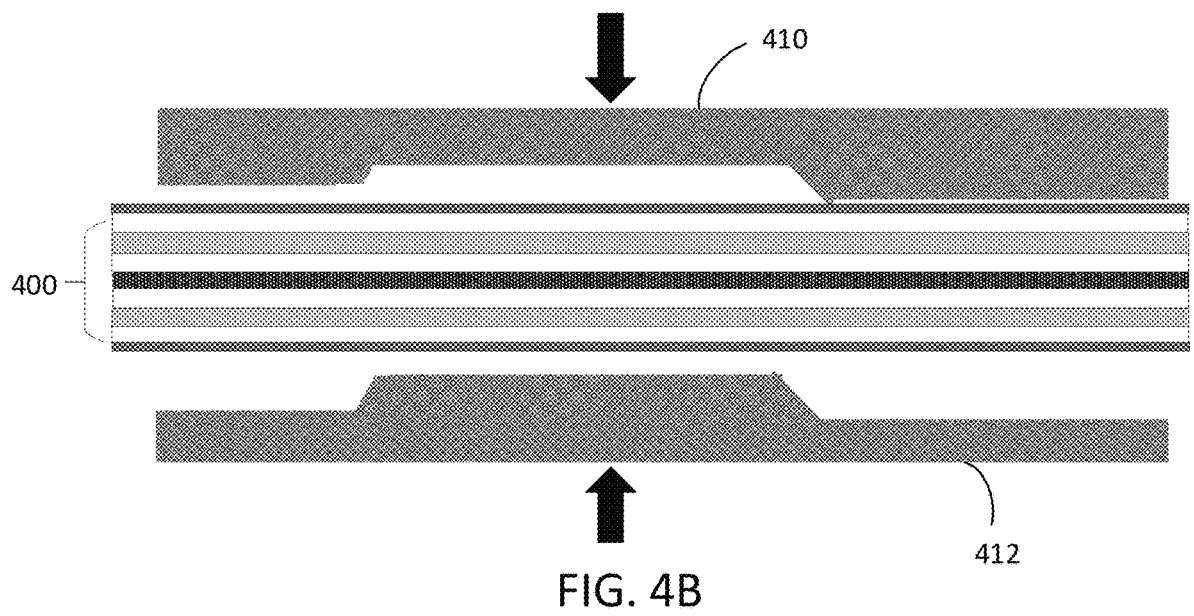
Figure 4C:
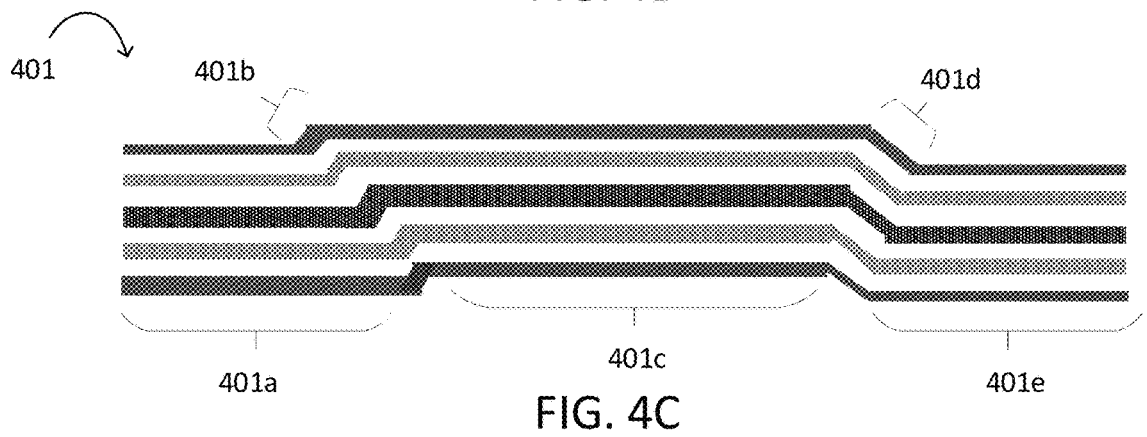

FIGS. 4A, 4B, and 4C are schematic illustrations of forming an exemplary multi-planar circuit board, according to some embodiments of the present disclosure. Circuit board 400 may include a printed circuit board having a core and multiple layers of alternating conductive layers and insulative layers on one side or on both sides of the core layer. Circuit board 400 may include a core 402, a conductive layer 404, a laminate or insulating layer 406, a second conductive layer 404, and, optionally, a flexible soldermask layer 408. Conductive layer 404 is typically the outermost layer before a soldermask or other finishing layer on a circuit board to form contact pads and other conductive features for coupling components to the circuit board. A single-sided circuit board may include alternating conductive and laminate layers on one side of core 402. A double-sided circuit board may include alternating conductive and laminate layers on both sides of core 402, as shown in FIG. 4A. Although only two conductive layers and one laminate layer are shown on each side of core 402 in FIG. 4A, circuit board 400 may include additional alternating conductive and laminate layers between core 402 and soldermask 408. The number of layers in a circuit board are defined by the number of conductive layers. For example, circuit board 400 having three conductive layers 404 is a 3-layer circuit board. In some embodiments, circuit board 400 may be a 4-layer, a 6-layer, or an 8-layer circuit board. The number of layers in circuit board 400 may depend on the amount and complexity of conductive routing required for the components and/or device.

Circuit board 400 (also referred to herein as a circuit board stack) may be formed using material layers that provide flexibility and stability to the circuit board such that the circuit board may be sufficiently flexible to be bent into multiple planes and sufficiently rigid to retain its shape after bending. The type of material selected for core layer 402, conductive layer 404, and laminate layer 406 may depend on the number of layers in the circuit board, the thickness of the layers, the total number of planar sections, the bend radius or angle (e.g., the amount of gradient or slope) required between two planar sections, and the flexibility and/or rigidity of other material layers, among others. In some embodiments, the thickness of circuit board 400 ranges from 0.1 mm to 5 mm. In some embodiments, the thickness of circuit board 400 ranges from 0.5 mm to 1 mm.

Core 402 may be made from any suitable insulating material having the desired properties for bendability and shape retention. In some embodiments, core 402 may be a flexible core, such as flexible copper clad laminate (FCCL). In some embodiments, core 402 may be a rigid core, such as a preimpregnated bonding sheet (e.g., FR4 or B-stage, which is a woven fiberglass cloth preimpregnated with epoxy resin). In some embodiments, core 402 may be a semi-rigid core, such as a resin copper clad (RCC), or a combination of FCCL and FR4 material. In some embodiments, the thickness of core 402 ranges from 5 microns to 100 microns (um). In some embodiments, the thickness of core 402 ranges from 35 um to 65 um. In some embodiments, the thickness of core 402 ranges from 45 um to 55 um Conductive layer 404 may be made from any suitable conductive material, including, for example, copper, nickel, and aluminum, among others. Conductive layer may include a foil or metal clad layer, such as copper foil, and may be of any suitable thickness for maintaining conductivity and connectivity, particularly, after bending. For example, conductive layer 404 may be a copper foil sheet of ½ ounce per square foot. In some embodiments, conductive layer 404 may be a copper foil sheet of ⅓ ounce per square foot. In some embodiments, conductive layer 404 may be a copper foil sheet of 1 ounce per square foot. In some embodiments, conductive layers 404 may have the same thickness. In some embodiments, some conductive layers may have different thicknesses as compared to other conductive layers.

Conductive layer 404 may be patterned using a lithography patterning process, for example, where photoresist is deposited and patterned on conductive areas using ultraviolet (UV) light, the resist is removed from areas not polarized by the UV light, the exposed conductive areas are removed by chemical etching, and the remaining photoresist is removed to reveal the patterned conductive features. In some embodiments, conductive layer 404 may be a continuous layer.

Laminate layer 406 may be formed using any suitable process, such as lamination. Laminate layer 406 may be made from any suitable material having the desired semi-flexible properties for bendability and shape retention, such as FCCL, FR4, or RCC. Laminate layer 406 may be any suitable thickness and may be adjusted to have the desired semi-rigidity or semi-flexibility depending on the type of material and/or the total number of layers. In some embodiments, laminate layer thickness ranges from 5 um to 40 um. In some embodiments, laminate layer thickness ranges from 15 um to 30 um. In some embodiments, laminate layer thickness ranges from 20 um to 25 um. In some embodiments, conductive layer 404 and laminate layer 406 are pre-formed metal clad laminate sheets that may be bonded together by pressure and/or heat during a lamination process to form alternating laminate and conductive layers on core 402. In some embodiments, the laminate layers are made from the same material. In some embodiments, the laminate layers are made from different materials, for example, a 3-layer circuit board may have a first laminate layer of FCCL material and a second laminate layer of RCC or FR4 material. Laminate layer material may be flexible, rigid, or semi-rigid, and may be selected based on the desired characteristics of the entire circuit board. For example, in some embodiments, an 8-layer double-sided circuit board may be formed from a flexible core, and then, on each side of the core, forming a first copper clad layer, a first FCCL laminate layer, a second copper clad layer, a first RCC laminate layer, a third copper clad layer, a second FCCL laminate layer, a fourth copper clad layer, and a solder mask layer. It will be understood that the number of layers, the type of material in each layer, the thickness of the layers, as well as the core, may be altered to optimize the desired characteristics of the circuit board and enable bending of the circuit board into multiple planes.

Flexible soldermask layer 408 may be applied using any suitable process and may be applied prior to bending.

FIG. 4B is a schematic illustration of a fixture mold designed in accordance with a multi-planar circuit board design for pressing and forming a circuit board into multiple planes. As is known in the art, fixture mold 410, 412 may be designed to form the planar sections and gradient sections as calculated for component placement on a circuit board to reduce overall z-height. Circuit board 400 may be pressed and formed between fixture mold 410, 412. As shown in FIG. 4B, circuit board 400 may be longer before being pressed by fixture mold to account for shortening of circuit board through bending.

FIG. 4C is a schematic illustration of circuit board after being pressed and formed by fixture mold. As shown in FIG. 4C, multi-layered circuit board 401 includes a first section 401a in a first plane, a second section 401c in a second plane, a third section 401e in a third plane, a first gradient section 401b connecting the first and second sections, and a second gradient section 401d connecting the second and third sections, where all sections (i.e., the first, second, third, first gradient, and second gradient sections) are sections within a contiguous circuit board. After bending, solder paste may be applied to the outer first and second faces of circuit board 401 using a 3-dimensional stencil having the same profile (e.g., planes and gradients) as the circuit board to provide conductive contacts points for coupling components, then components may be placed and coupled in accordance with the designed placement and z-depth location.

Various operations will be described as multiple discrete operations, in turn, in a manner that is most helpful in understanding the present disclosure. However, the order of description should not be construed to imply that these operations are necessarily order dependent or performed only once each. In particular, these operations need not be performed in the order of presentation, and may be repeated or performed in a different order (e.g., parallel). Operations described may be performed in a different order from the described embodiment(s). Various additional operations may be performed, and/or described operations may be omitted in additional embodiments.

Figure 5:
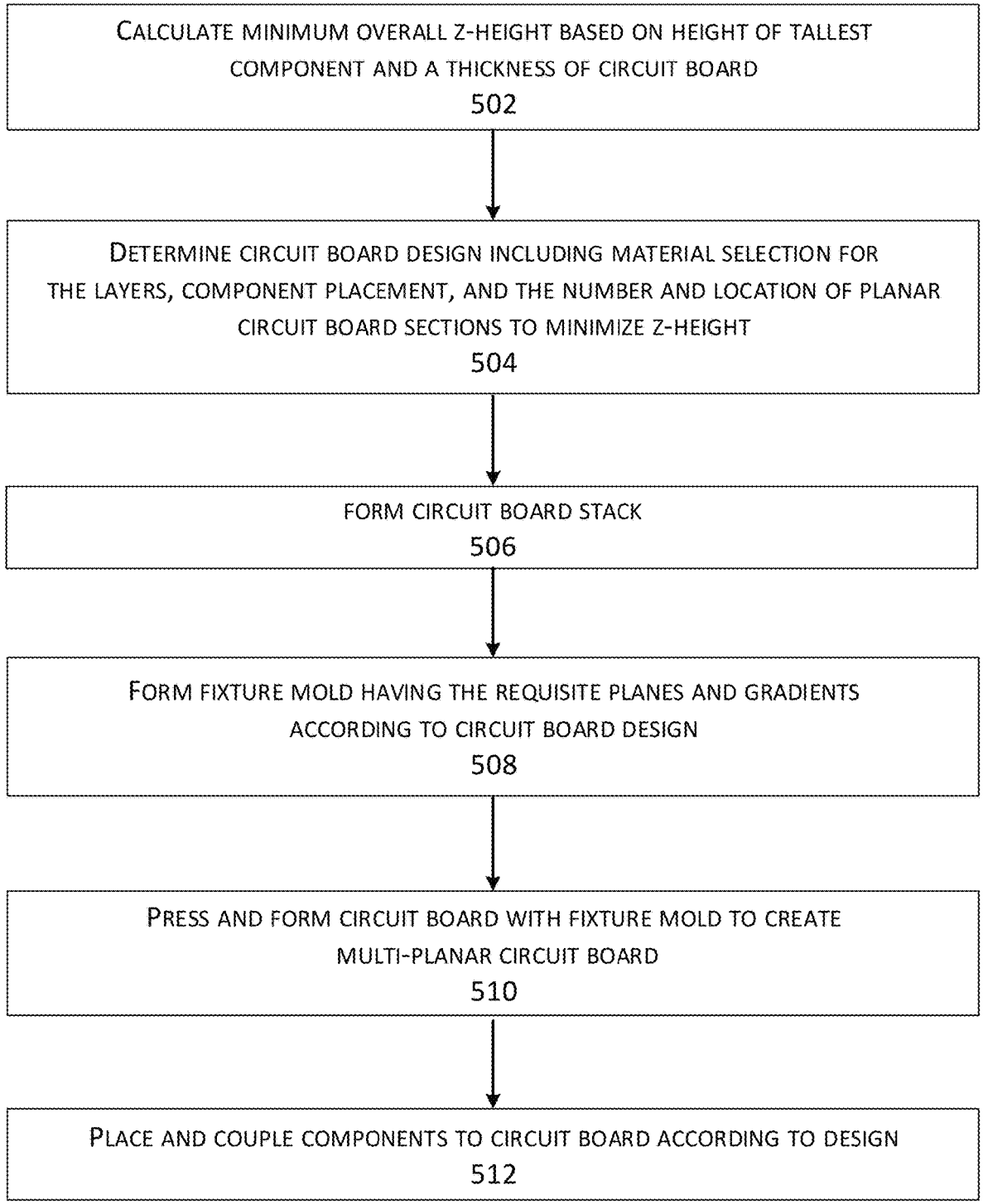
FIG. 5 is a flow chart of an exemplary method for fabricating a multi-planar circuit board, according to some embodiments of the present disclosure.

FIG. 5 is a flow chart of an exemplary method of forming a multi-planar circuit board, in accordance with various embodiments. At 502, a minimum overall z-height may be calculated for a circuit board based on the height of the tallest component and the thickness of the circuit board. The thickness of the circuit board may vary depending on the number of layers and the type of materials used in the layers, including the core. At 504, circuit board design may be determined using the minimum overall z-height as a basis for component placement and for identifying the number and location of planar sections as well as gradient sections connecting the planar sections. Circuit board design may include forming the circuit board stack using core, laminate, and conductive materials that may be selected to achieve the desired bendable and shape-retaining properties. At 506, a circuit board stack may be formed. At 508, a fixture mold having the requisite planes and gradients according to the circuit board design in an inverse profile may be formed. At 510, circuit board stack may be pressed and formed by the fixture mold to create a multi-planar circuit board. At 512, components may be placed on and coupled to the circuit board.

Figure 6A:
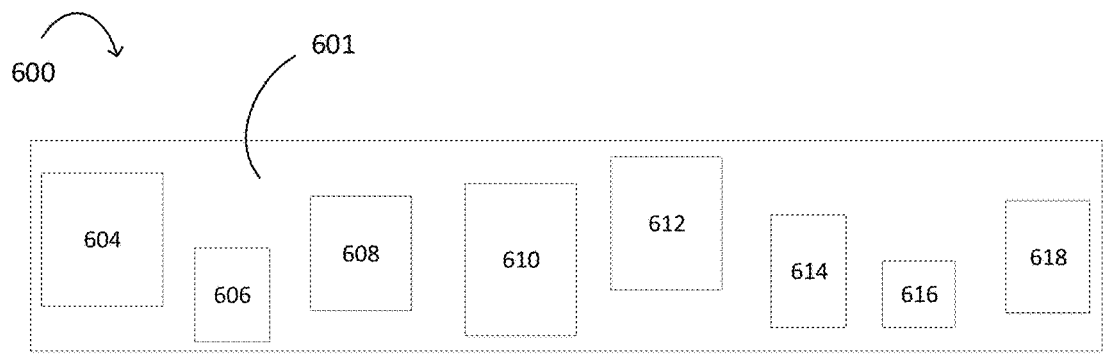
FIG. 6A is a schematic illustration of a top view of a circuit board showing components coupled to a first face.

FIG. 6A is a schematic illustration of a top view of a circuit board showing components coupled to a first face. Assembly 600 may include circuit board 601 having components 604, 606, 608, 610, 612, 614, 616, 618 coupled thereon.

Figure 6B:
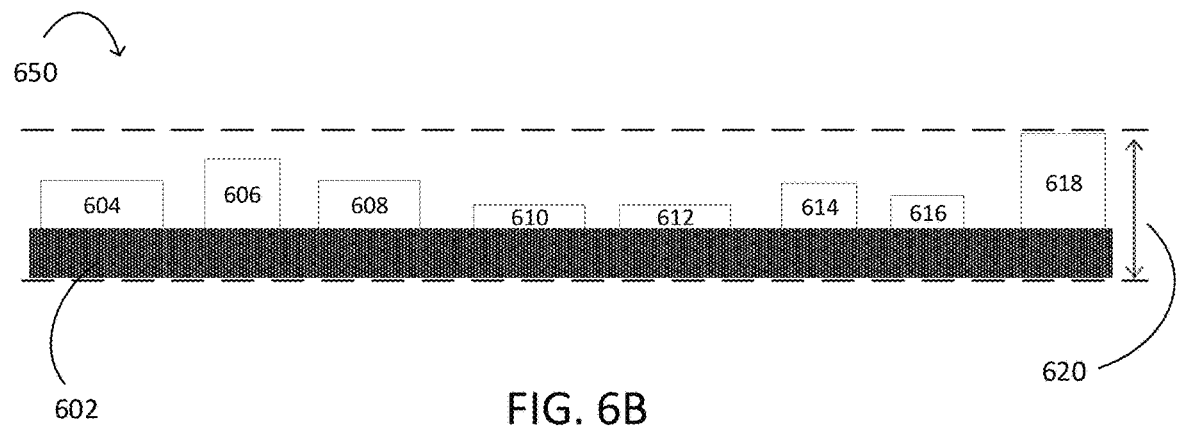
FIG. 6B is a schematic illustration of a side view of a single-sided planar circuit board showing components coupled to a first face.

FIG. 6B is a schematic illustration of a side view of a single-sided planar circuit board showing components coupled to a first face. Assembly 650 may include a circuit board 602 in a single plane having a plurality of components 604, 606, 608, 610, 612, 614, 616, 618 coupled to a first face. In FIG. 6B, the overall z-height 620 equals the thickness of the circuit board 602 plus the height of the tallest component 618, which is the thinnest z-height achievable with the single-sided planar circuit board and components as shown in FIG. 6B.

Figure 6C:
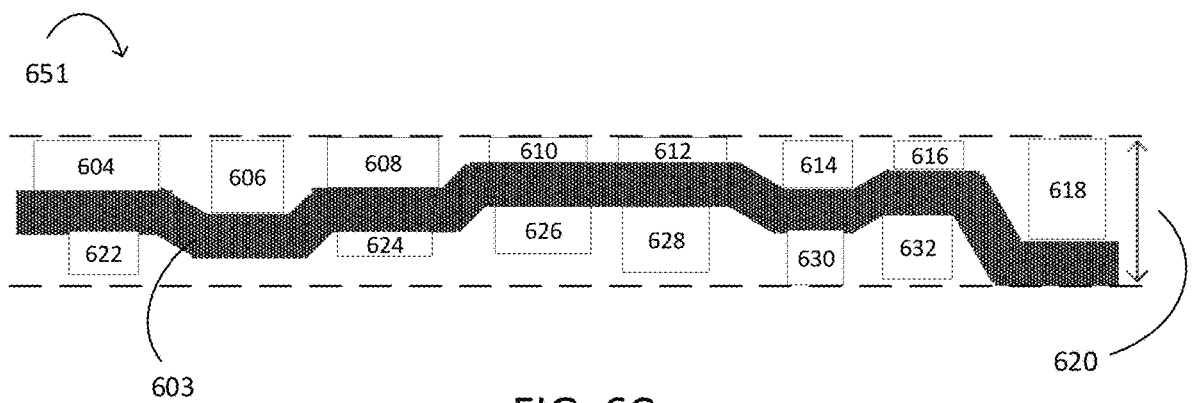
FIG. 6C is a schematic illustration of a side view of a multi-planar circuit board showing components coupled to a first and second face, according to some embodiments of the present disclosure.

FIG. 6C is a schematic illustration of a side view of a multi-planar circuit board showing components coupled to a first and second surface, according to some embodiments of the present disclosure. Assembly 651 may include a multi-planar circuit board 603 having a plurality of components 604, 606, 608, 610, 612, 614, 616, 618 coupled on a first surface, and a plurality of components 622, 624, 626, 628, 630, 632 coupled on an opposing second surface. In FIG. 6C, the overall z-height 620 equals the thickness of the circuit board 603 plus the height of the tallest component 618, which is the thinnest z-height achievable with the single-sided planar circuit board and components as shown in FIG. 6C. Assuming circuit boards 602, 603 have the same thickness, multi-planar circuit board assembly 651 allows for six additional components within the same overall z-height. FIG. 6C depicts a more complicated example of a multi-planar circuit board having seven planar sections and six gradient sections. Generally, a multi-planar circuit board may have any number of planar sections with connecting gradient sections as necessary. For example, a simpler circuit board having less components may have two planar sections while a more complicated circuit board having more components may have 20 or more planar sections.

Figure 7:
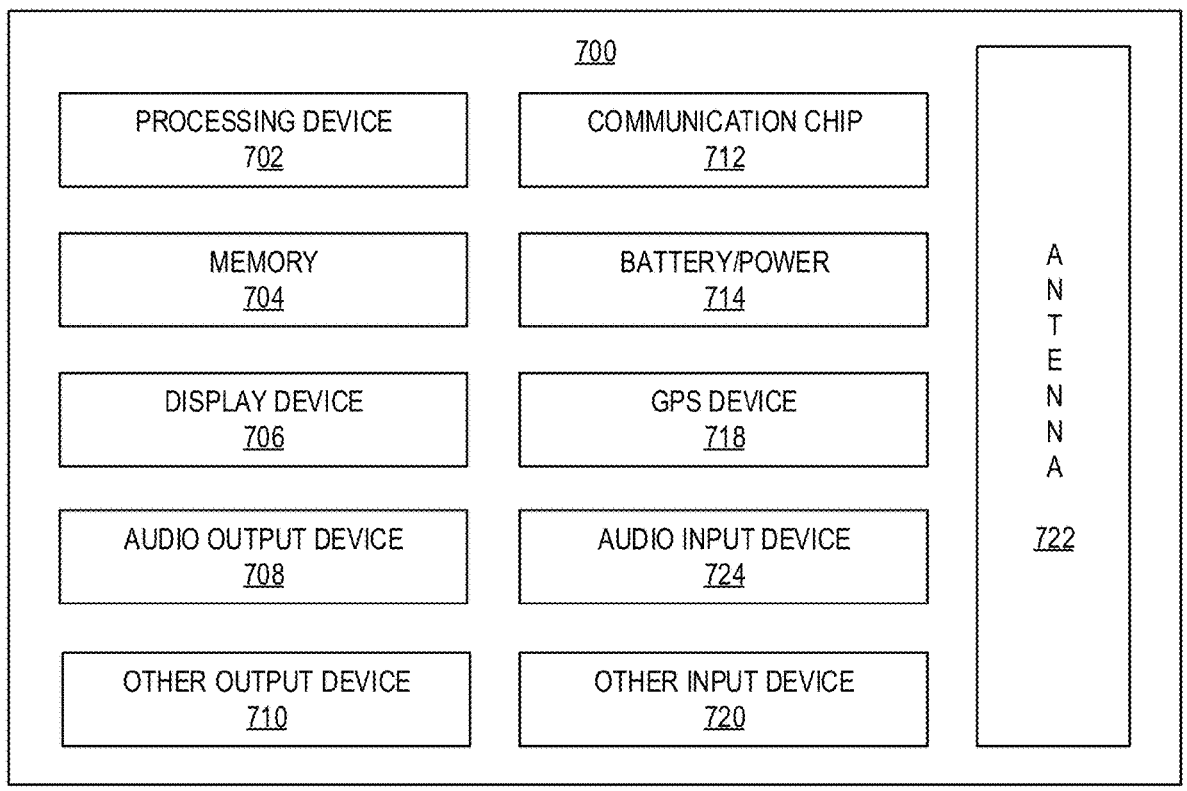
FIG. 7 is a block diagram of an example computing device that may include any of the embodiments of the multi-planar circuit boards disclosed herein.

FIG. 7 is a block diagram of an example computing device 700 that may include one or more of the multi-planar circuit boards disclosed herein. A number of components are illustrated in FIG. 7 as included in the computing device 700, but any one or more of these components may be omitted or duplicated, as suitable for the application. In some embodiments, some or all of the components included in the computing device 700 may be attached to one or more multi-planar circuit boards disclosed herein. In some embodiments, some or all of these components are fabricated onto a single system-on-a-chip (SoC) die.

Additionally, in various embodiments, the computing device 700 may include interface circuitry for coupling to the one or more components. For example, the computing device 700 may not include a display device 706, but may include display device interface circuitry (e.g., a connector and driver circuitry) to which a display device 706 may be coupled. In another set of examples, the computing device 700 may not include an audio input device 724 or an audio output device 708, but may include audio input or output device interface circuitry (e.g., connectors and supporting circuitry) to which an audio input device 724 or audio output device 708 may be coupled.

The computing device 700 may include a processing device 702 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 702 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The computing device 700 may include a memory 704, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the memory 704 may include memory that shares a die with the processing device 702. This memory may be used as cache memory and may include embedded dynamic random access memory (eDRAM) or spin transfer torque magnetic random-access memory (STT-MRAM).

In some embodiments, the computing device 700 may include a communication chip 712 (e.g., one or more communication chips). For example, the communication chip 712 may be configured for managing wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 712 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra-mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 712 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 712 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 712 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 712 may operate in accordance with other wireless protocols in other embodiments. The computing device 700 may include an antenna 722 to facilitate wireless communications and/or to receive other wireless communications (such as AM or FM radio transmissions).

In some embodiments, the communication chip 712 may manage wired communications, such as electrical, optical, or any other suitable communication protocols (e.g., the Ethernet). As noted above, the communication chip 712 may include multiple communication chips. For instance, a first communication chip 712 may be dedicated to shorter-range wireless communications such as Wi-Fi or Bluetooth, and a second communication chip 712 may be dedicated to longer-range wireless communications such as GPS, EDGE, GPRS, CDMA, WiMAX, LTE, EV-DO, or others. In some embodiments, a first communication chip 712 may be dedicated to wireless communications, and a second communication chip 712 may be dedicated to wired communications.

The computing device 700 may include battery/power circuitry 714. The battery/power circuitry 714 may include one or more energy storage devices (e.g., batteries or capacitors) and/or circuitry for coupling components of the computing device 700 to an energy source separate from the computing device 700 (e.g., AC line power).

The computing device 700 may include a display device 706 (or corresponding interface circuitry, as discussed above). The display device 706 may include any visual indicators, such as a heads-up display, a computer monitor, a projector, a touchscreen display, a liquid crystal display (LCD), a light-emitting diode display, or a flat panel display, for example.

The computing device 700 may include an audio output device 708 (or corresponding interface circuitry, as discussed above). The audio output device 708 may include any device that generates an audible indicator, such as speakers, headsets, or earbuds, for example.

The computing device 700 may include an audio input device 724 (or corresponding interface circuitry, as discussed above). The audio input device 724 may include any device that generates a signal representative of a sound, such as microphones, microphone arrays, or digital instruments (e.g., instruments having a musical instrument digital interface (MIDI) output).

The computing device 700 may include a global positioning system (GPS) device 718 (or corresponding interface circuitry, as discussed above). The GPS device 718 may be in communication with a satellite-based system and may receive a location of the computing device 700, as known in the art.

The computing device 700 may include an other output device 710 (or corresponding interface circuitry, as discussed above). Examples of the other output device 710 may include an audio codec, a video codec, a printer, a wired or wireless transmitter for providing information to other devices, or an additional storage device.

The computing device 700 may include an other input device 720 (or corresponding interface circuitry, as discussed above). Examples of the other input device 720 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 700 may have any desired form factor, such as a hand-held or mobile computing device (e.g., a cell phone, a smart phone, a mobile internet device, a music player, a tablet computer, a laptop computer, a netbook computer, an ultrabook computer, a personal digital assistant (PDA), an ultra-mobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, the computing device 700 may be any other electronic device that processes data.

The following examples pertain to further embodiments. The various features of the different embodiments may be variously combined with some features included and others excluded to suit a variety of different applications.

Example 1 is an electronic assembly including: a circuit board having a first surface; a first section of the circuit board having the first surface in a first plane; a second section of the circuit board having the first surface in a second plane; and a third section of the circuit board, between the first and second sections, defining a gradient in the first surface between the first and second planes, wherein the first, second and third sections are contiguous.

Example 2 may include the subject matter of Example 1, and may further include: a first component having a first thickness coupled to the first surface of the first section; and a second component having a second thickness coupled to the first surface of the second section, wherein the second thickness is greater than the first thickness, and wherein the second plane is in a lower plane as compared to the first plane.

Example 3 may include the subject matter of Example 2, and may further specify that the overall thickness is equal to the thickness of the circuit board added to the second thickness of the second component.

Example 4 may include the subject matter of Example 2, and may further include: a second surface opposing the first surface; and a third component having a third thickness coupled to the second surface of the first section of the circuit board.

Example 5 may include the subject matter of Example 4, and may further specify that the third thickness does not increase the overall thickness.

Example 6 may include the subject matter of Example 1, and may further specify that the thickness of the circuit board ranges from 0.5 mm to 1 mm.

Example 7 may include the subject matter of Example 1, and may further specify that the first, second, and third sections further include: a core layer, a conductive layer, and a laminate layer.

Example 8 may include the subject matter of Example 7, and may further specify that the core layer is a flexible core.

Example 9 may include the subject matter of Example 1, and may further include: a fourth section of the circuit board having the first surface in a third plane; and a fifth section of the circuit board, between the second and fourth sections, defining a gradient in the first surface between the second and third planes, wherein the first, second, third, fourth, and fifth sections are contiguous.

Example 10. is a method for fabricating an electronic assembly, the method including: forming a circuit board having opposing first and second surfaces comprising a core and alternating layers of conductive material and insulating material coupled to the core; and bending the circuit board to form a first section of the circuit board having the first surface in a first plane, a second section of the circuit board having the first surface in a second plane, and a third section of the circuit board, between the first and second sections, defining a gradient in the first surface between the first and second planes.

Example 11 may include the subject matter of Example 10, and may further specify that bending the circuit board is performed using a fixture mold.

Example 12 may include the subject matter of Example 10, and may further include: coupling a first component having a first thickness to the first surface of the first section; and coupling a second component having a second thickness to the first surface of the second section, wherein the second thickness is greater than the first thickness, and wherein the second plane is in a lower plane as compared to the first plane.

Example 13 may include the subject matter of Example 12, and may further specify that the overall thickness is equal to the thickness of the circuit board added to the second thickness of the second component.

Example 14 may include the subject matter of Example 12, and may further include: coupling a third component having a third thickness to the second surface of the first section of the circuit board.

Example 15 may include the subject matter of Example 14, and may further specify that the third thickness does not increase the overall thickness.

Example 16 may include the subject matter of Example 10, and may further sepcify that the thickness of the circuit board thickness ranges from 0.5 mm to 1 mm.

Example 17 may include the subject matter of Example 10, and may further specify that the thickness of the laminate layer ranges from 15 um to 30 um.

Example 18 may include the subject matter of Example 10, and may further specify that the core layer is a flexible copper clad laminate.

Example 19 is an apparatus including: a circuit board having a first surface; a first section of the circuit board having the first surface in a first plane; a second section of the circuit board having the first surface in a second plane; and a third section of the circuit board, between the first and second sections, defining a gradient in the first surface between the first and second planes, wherein the first, second and third sections are contiguous.

Example 20 may include the subject matter of Example 19, and may further include: a first component having a first thickness coupled to the first surface of the first section; and a second component having a second thickness coupled to the first surface of the second section, wherein the second thickness is greater than the first thickness, and wherein the second plane is in a lower plane as compared to the first plane.

Example 21 may include the subject matter of Example 20, and may further specify that the overall thickness is equal to the thickness of the circuit board added to the second thickness of the second component.

Example 22 may include the subject matter of Example 20, and may further include: a second surface opposing the first surface; and a third component having a third thickness coupled to the second surface of the first section of the circuit board.

Example 23 may include the subject matter of Example 22, and may further specify that the third thickness does not increase the overall thickness.

Example 24 may include the subject matter of any of Examples 19-23, and may further specify that the circuit board is a printed circuit board.

Example 25 may include the subject matter of any of Examples 19-24, and may further specify that the first, second, and third sections include: a core layer, a conductive layer, and a laminate layer.

Example 26 may include the subject matter of Example 25, and may further specify that the core layer is a flexible core.

Example 27 may include the subject matter of Example 19, and may further include: a fourth section of the circuit board having the first surface in a third plane; and a fifth section of the circuit board, between the second and fourth sections, defining a gradient in the first surface between the second and third planes, wherein the first, second, third, fourth, and fifth sections are contiguous.

Example 28 may include the subject matter of Example 20, and may further sepcify that the first component is an integrated circuit package comprising a package substrate having a plurality of build up layers and a die coupled to the package substrate.

Example 29 is a device including: a printed circuit board (PCB) having a first surface, the PCB including: a first section of the PCB having the first surface in a first plane; a second section of the PCB having the first surface in a second plane; and a third section of the PCB, between the first and second sections, defining a gradient in the first surface between the first and second planes, wherein the first, second and third sections are contiguous; a first component having a first thickness coupled to the first surface of the first section of the PCB; and a second component having a second thickness coupled to the first surface of the second section of the PCB, wherein the second thickness is greater than the first thickness, and wherein the second plane is in a lower plane as compared to the first plane.

Example 30 may include the subject matter of Example 29, and may further specify that the overall thickness is equal to the thickness of the circuit board added to the second thickness of the second component.

Example 31 may include the subject matter of Example 30, and may further include: a third component having a third thickness coupled to the second surface of the first section of the PCB, wherein the second surface is opposite the first surface, and may further specify that the third thickness does not increase the overall thickness.

Example 32 may include the subject matter of Example 29, and may further sepcify that the first, second, and third sections include: a core layer, a conductive layer, and a laminate layer.

Example 33 may include the subject matter of Example 32, and may further specify that the core layer material comprises one or more of a flexible copper clad laminate, a resin copper clad, and a preimpregnated bonding sheet.

Example 34 may include the subject matter of Example 29, and may further specify that the first component is an integrated circuit package comprising: a package substrate having a plurality of build up layers, wherein the package substrate is coupled to the PCB on the land side surface; and a die, wherein the die is coupled to the package substrate on the die side surface.

Example 35 is a computing device, including: a circuit board, including: a first surface; a first section of the circuit board having the first surface in a first plane; a second section of the circuit board having the first surface in a second plane; and a third section of the circuit board, between the first and second sections, defining a gradient in the first surface between the first and second planes, wherein the first, second and third sections are contiguous; a first integrated circuit package having a first thickness coupled to the first surface of the first section of the circuit board; and a second integrated circuit package having a second thickness coupled to the first surface of the second section of the circuit board, wherein the second thickness is greater than the first thickness, and wherein the second plane is in a lower plane as compared to the first plane.

Example 36 may include the subject matter of Example 35, and may further specify that the overall thickness is equal to the thickness of the circuit board added to the second thickness of the second integrated circuit package.

Example 37 may include the subject matter of Example 36, and may further include: a third integrated circuit package having a third thickness coupled to the second surface of the first section of the circuit board, wherein the second surface is opposite the first surface.

Example 38 may include the subject matter of Example 37, and may further specify that the third thickness does not increase the overall thickness.

The invention claimed is:

1. An electronic assembly comprising:
   a circuit board, including:
      a first section of the circuit board in a first plane;
      a second section of the circuit board in a second plane different from the first plane;
      a third section of the circuit board, between the first and second sections, wherein the third section slopes between the first and second planes;
      a fourth section of the circuit board in a third plane different from the first and second planes; and
      a fifth section of the circuit board, between the second and fourth sections, wherein the fifth section slopes between the second and third planes, and wherein the first, second, third, fourth, and fifth sections are contiguous.

2. The electronic assembly of claim 1, wherein the circuit board has a first surface and an opposing second surface, and further comprising:
   a first component having a first thickness coupled to the first surface of the first section;
   and a second component having a second thickness coupled to the first surface of the second section, wherein the second thickness is greater than the first thickness, and wherein the second plane is in a lower plane as compared to the first plane.

3. The electronic assembly of claim 2, wherein an overall thickness is equal to a thickness of the circuit board added to the second thickness of the second component.

4. The electronic assembly of claim 3, further comprising:
   a third component having a third thickness coupled to the second surface of the first section of the circuit board.

5. The electronic assembly of claim 4, wherein the third thickness does not increase the overall thickness.

6. The electronic assembly of claim 1, wherein a thickness of the circuit board is between 0.5 mm and 1 mm.

7. The electronic assembly of claim 1, wherein the circuit board further includes:
   a core layer, a conductive layer, and a laminate layer.

8. The electronic assembly of claim 7, wherein the core layer is a flexible core.

9. A method for fabricating an electronic assembly, the method comprising:
   forming a circuit board having opposing first and second surfaces comprising a core and alternating layers of conductive material and insulating material coupled to the core, wherein the circuit board has a thickness; and
   bending the circuit board to form a first section of the circuit board in a first plane, a second section of the circuit board in a second plane different from the first plane, a third section of the circuit board, between the first and second sections, wherein the third section slopes between the first and second planes, a fourth section of the circuit board in a third plane different from the first and second planes, and a fifth section of the circuit board, between the second and fourth sections, wherein the fifth section slopes between the second and third planes, wherein the first, second, third, fourth, and fifth sections are contiguous.

10. The method of claim 9, wherein bending the circuit board is performed using a fixture mold.

11. The method of claim 9, further comprising:
   coupling a first component having a first thickness to the first surface of the first section; and
   coupling a second component having a second thickness to the first surface of the second section, wherein the second thickness is greater than the first thickness, and wherein the second plane is in a lower plane as compared to the first plane.

12. The method of claim 11, wherein an overall thickness is equal to the thickness of the circuit board added to the second thickness of the second component.

13. The method of claim 12, further comprising:
   coupling a third component having a third thickness to the second surface of the first section of the circuit board.

14. The method of claim 13, wherein the third thickness does not increase the overall thickness.

15. An apparatus comprising:
   a circuit board, including:
      a first section of the circuit board in a first plane;
      a second section of the circuit board in a second plane different from the first plane;
      a third section of the circuit board, between the first and second sections, wherein the third section slopes between the first and second planes;
      a fourth section of the circuit board in a third plane different from the t and second planes; and
      a fifth section of the circuit board, between the second and fourth sections, wherein the fifth section slopes between the second and third planes, and wherein the first, second, third, fourth, and fifth sections are contiguous.

16. The apparatus of claim 15, wherein the circuit board has a first surface and an opposing second surface, and further comprising:
   a first component having a first thickness coupled to the first surface of the first section;

and a second component having a second thickness coupled to the first surface of the second section, wherein the second thickness is greater than the first thickness, and wherein the second plane is in a lower plane as compared to the first plane.

17. The apparatus of claim 16, wherein an overall thickness is equal to a thickness of the circuit board added to the second thickness of the second component.

18. The apparatus of claim 15, wherein the circuit board is a printed circuit board.

19. The apparatus of claim 16, wherein the first component is an integrated circuit package comprising a package substrate having a plurality of build up layers and a die coupled to the package substrate.

20. A device, comprising:
    a printed circuit board (PCB) having a first surface and an opposing second surface, comprising:
        a first section of the PCB in a first plane;
        a second section of the PCB in a second plane different from the first plane;
        a third section of the PCB, between the first and second sections, wherein the third section slopes between the first and second planes;
        a fourth section of the PCB in a third plane different from the first and second planes; and
        a fifth section of the PCB, between the second and fourth sections, wherein the fifth section slopes between the second and third planes, and wherein the first, second, third, fourth, and fifth sections are contiguous;
    a first component having a first thickness coupled to the first surface of the first section of the PCB; and
    a second component having a second thickness coupled to the first surface of the second section of the PCB, wherein the second thickness is greater than the first thickness, and wherein the second plane is in a lower plane as compared to the first plane.

21. The device of claim 20, wherein an overall thickness is equal to a thickness of the PCB added to the second thickness of the second component.

22. The device of claim 21, further comprising:
    a third component having a third thickness coupled to the second surface of the first section of the PCB, wherein the third thickness does not increase the overall thickness.

23. The device of claim 20, wherein the PCB further includes:
    a core layer, a conductive layer, and a laminate layer.

24. The device of claim 20, wherein the first component is an integrated circuit package comprising:
    a package substrate having a plurality of build up layers, wherein the package substrate is coupled to the PCB on a land side surface; and
    a die, wherein the die is coupled to the package substrate on a die side surface.

* * * * *

UNITED STATES PATENT AND TRADEMARK OFFICE
CERTIFICATE OF CORRECTION

PATENT NO. : 11,172,581 B2  
APPLICATION NO. : 16/003970  
DATED : November 9, 2021  
INVENTOR(S) : Eng Huat Goh et al.

Page 1 of 1

It is certified that error appears in the above-identified patent and that said Letters Patent is hereby corrected as shown below:

In the Claims

In Column 16, Claim 15, Line 57, delete "the t" and insert -- the first --, therefor.

Signed and Sealed this  
Eighth Day of February, 2022

Drew Hirshfeld  
*Performing the Functions and Duties of the*  
*Under Secretary of Commerce for Intellectual Property and*  
*Director of the United States Patent and Trademark Office*